United States Patent [19]

Baker

[11] 4,246,501
[45] Jan. 20, 1981

[54] GATED BACK-CLAMPED TRANSISTOR SWITCHING CIRCUIT

[75] Inventor: Richard H. Baker, Bedford, Mass.

[73] Assignee: Exxon Research & Engineering Co., Florham Park, N.J.

[21] Appl. No.: 944,562

[22] Filed: Sep. 21, 1978

[51] Int. Cl.³ .............. H03K 3/33; H03K 19/08; H03K 17/60; H03K 23/30
[52] U.S. Cl. ........................... 307/300; 307/237; 307/280; 307/319
[58] Field of Search ............ 307/237, 280, 300, 319, 307/281

[56] References Cited

U.S. PATENT DOCUMENTS

| | | | |
|---|---|---|---|
| B 530,285 | 4/1976 | Sakamoto et al. | 307/300 |
| 3,010,031 | 11/1961 | Baker | 307/300 |
| 3,083,303 | 3/1963 | Knowles et al. | 307/300 |
| 3,160,765 | 12/1964 | Krossa | 307/300 X |
| 3,534,281 | 10/1970 | Hillhouse | 307/300 X |
| 4,109,166 | 8/1978 | Clark, Jr. et al. | 307/300 |
| 4,118,640 | 10/1978 | Ochi et al. | 307/300 |
| 4,123,670 | 10/1978 | Pollmeier | 307/300 |

FOREIGN PATENT DOCUMENTS 1222014  2/1971  United Kingdom .

Primary Examiner—Saxfield Chatmon, Jr.
Attorney, Agent, or Firm—Kenneth Watov

[57] ABSTRACT

The output transistor of a switching circuit is driven into saturation for obtaining fast turnon thereof, and maintained in saturation during a substantial portion of its period of operation, for obtaining minimum power dissipation thereof relative to its unsaturated state. A short time before turning off the output transistor, a diode is connected across its base and collector electrodes, for diverting some of the base current from the base electrode into the collector electrode thereof, thereby causing the transistor to come out of saturation, reducing the accumulated charge in the base region thereof, permitting faster turnoff of the transistor relative to its saturated state.

19 Claims, 4 Drawing Figures

GATED BACK-CLAMPED TRANSISTOR SWITCHING CIRCUIT

The field of the present invention relates generally to transistor switching circuits, and more specifically to power transistor circuitry providing fast turnon and turnoff times, with minimum power dissipation.

The operation of transistors directly from a cut-off condition into their saturation region produces fast turnon times, but slow turnoff times as a result of storage delay. The excess base current needed to drive a transistor into saturation causes an accumulation of stored charge in the base region, which must be removed before the transistor switch can be turned off. The time required for removing this accumulated charge is known as the storage time $t_s$. Over the past twenty years various schemes have been devised to overcome the storage time delay, for reducing the turnoff time of the transistor by not allowing the transistor to operate in saturation. When a transistor is operated in its unsaturated region, the voltage drop across its collector-emitter electrodes ($V_{CE}$) is greater than when the transistor is operating in its saturated state. Also, a transistor operating in its unsaturated state will have a much higher frequency response, and a faster turnoff time, relative to operation in its saturated state. In low-power transistor switching circuits, operation in the unsaturated mode is desirable for obtaining the fast turnoff time, and the increased $V_{CE}$ voltage is of little consequence, in that it causes only a negligible increase in the power dissipation of the transistor. Contrariwise, in high-power transistor switching circuits, the fast turnoff time is also very desirable, but the attendant increase in the $V_{CE}$ voltage while operating in an unsaturated mode relative to a saturated mode is undesirable because it substantially increases the power dissipation of the transistor.

The present invention overcomes the disadvantages in the prior art by providing sufficient current flow in the base electrode of an output transistor for rapidly turning it on into saturation, for obtaining the fastest turnon thereof. The transistor is maintained in saturation for a substantial portion of its period of operation, in order to operate the transistor with the lowest power dissipation. A short time before it is desired to turn off the output transistor, a diode is connected between the base and collector electrodes of the transistor for diverting some of the base current from the base electrode to the collector electrode, thereby bringing the transistor out of saturation, thereafter permitting faster turnoff of the transistor.

In the drawings, wherein the same reference designations are used for like elements:

Figure 1:
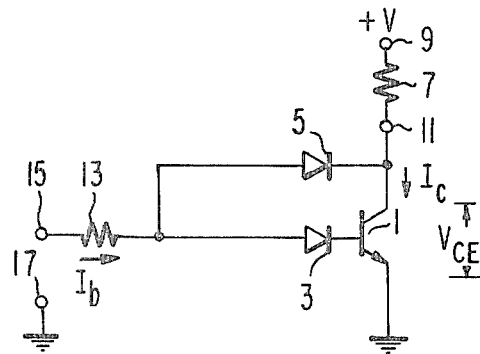
FIG. 1 is a circuit schematic diagram of a back-clamped transistor switching circuit for operating an output transistor only in an unsaturated state.

In FIG. 1, a method and apparatus in the prior art for preventing saturation of a transistor is the use of back-clamping, as taught in my U.S. Pat. No. 3,010,031, issued on Nov. 21, 1961. To ensure that the collector-to-base junction of transistor 1 can never become forward-biased (to avoid saturation), it is required that the voltage across diode 3 be greater than the voltage across diode 5. In order to obtain maximum speeds, the recovery time of diode 5 from a forward-bias to a reverse-bias condition must be small in relation to that of transistor 1 in going from an unsaturated to a cutoff state. Circuit operation is based upon nonlinear feedback provided by the two diodes 3,5 between the collector and base electrodes. When the collector current $I_c$ increases as a result of a change in current gain ($h_{fe}$), the current through diode 5 increases. This results in some of the base current $I_b$ being diverted from the base electrode to the collector electrode via the current conduction path provided by diode 5, thus preventing the transistor from going into saturation. The function of diode 3 is to allow the base current of the transistor to be channeled through diode 5 to the collector electrode, even when the collector and base electrodes are at the same potential. Although back-clamping does increase the $V_{CE}$ of transistor 1 when turned on, the transistor will have a much higher frequency response during its "on" state and consequently, a fast turnoff time as previously mentioned. Note that a load 7 is connected between power terminal 9 receiving an operating voltage $+V$, and output terminal 11. Also shown is a current source or current-limiting resistor 13 connected between the common connections of the diodes 3,5 and input terminal 15. A second input or reference voltage terminal 17 is shown for receiving a source of reference potential, or for connection to a point of reference potential. Control signals are applied across terminals 15 and 17 for turning on transistor 1 when the control signals are at a relatively "high" level of voltage (some positive level in this example), and for turning off transistor 1 when at the level of the source of reference potential, ground in this example, or some negative level of voltage. When the control signal source is a current source, resistor 13 can be eliminated, whereas if the control signal source is a voltage source, it is desirable to include resistor 13.

Figure 2:
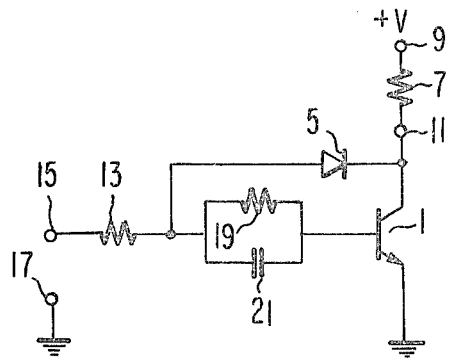
FIG. 2 is a circuit schematic diagram of another embodiment of the prior art circuit of FIG. 1.

In FIG. 2, there is shown a modified version of the circuit of FIG. 1. The modification consists of replacing the diode 3 with a speedup circuit including resistor 19 in parallel with speedup capacitor 21, as shown. The impedance of this speedup circuit 19,21 must be greater than the impedance of diode 5 when forward biased, to ensure that the transistor 1 can be operated only in its unsaturated state. The capacitor 21, as would be known to one skilled in the art, appears as a short circuit at the instant of application of a positive-going control signal for turning on transistor 1, thereby speeding up the turnon of this transistor. After a short period of time, the capacitor 21 becomes charged and the base current for maintaining transistor 1 turned on flows primarily through resistor 19 of the speedup circuit, with some base current being diverted via diode 5 to the collector electrode of transistor 1, as previously described.

Figure 3:
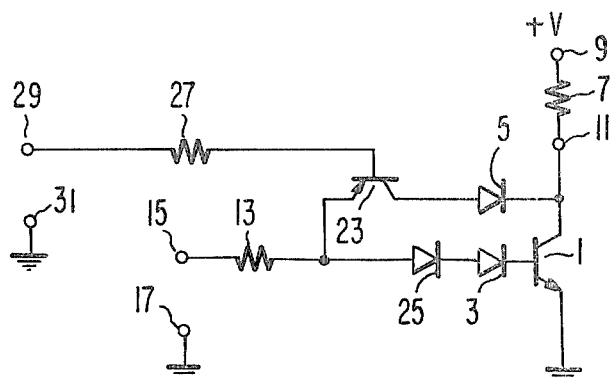
FIG. 3 is a circuit schematic diagram of one embodiment of the present invention.

In FIG. 3, a first embodiment of the invention is shown. The back-clamping diode 5 can be selectively connected into or out of the circuit via the turning on and turning off of the mode or switching transistor 23, as will be described. When transistor 23 is turned on via the application of a negative polarity or "low" control signal across input terminals 29,31, the relative impedance between the collector and emitter electrodes of transistor 23 substantially decreases, effectively connecting the back-clamping diode 5 between the collector electrode of output transistor 1 and the common connection of resistor 13 and diode 25. Accordingly, whenever transistor 23 is so turned on, the circuit operates in the same manner as the circuit of FIG. 1. With transistor 23 turned on, the output transistor 1 is nonconducting when the control signal applied across terminals 15 and 17 is "low" (at a negative potential with respect to ground), or the transistor 1 is turned on in an unsaturated condition with the control signal applied between terminals 15 and 17 is "high (at a positive potential with respect to ground in this example). As previously mentioned, the conduction of the output transistor 1 in a nonsaturated state provides fast turnoff time but at the expense of high-power dissipation due to the relatively high "on" voltage across the collector-emitter electrodes of this transistor at this time.

When transistor 23 is turned off via the application of a "high" level control signal at input terminal 29, the output transistor 1 can either be off, via the application of a "low" level control signal at input terminal 15, or can be turned on into saturation via the application of a "high" level control signal at input terminal 15. As previously mentioned, operation of transistor 1 in a saturated state provides for slow turnoff time thereof but low-power dissipation, relative to the unsaturated state. Accordingly, the beneficial combination of fast turnoff time and low-power dissipation can be obtained by turning transistor 23 on and off at certain predetermined times, as will be described.

Assume that the control signals applied to input terminals 29 and 15 are both "high". Such signaling causes transistor 23 to be turned off and the output transistor 1 to be conducting in a saturated state with low-power dissipation. As previously mentioned, the operation of output transistor 1 in a saturated state would cause this transistor to turnoff more slowly than from an unsaturated state. However, if the control signal applied to input terminal 29 is caused to go low, about ten microseconds, for example, before initiating the turnoff of the output transistor 1 by causing the control signal applied to go low, enhanced operation of the transistor switching circuit is obtained. Before transistor 23 is turned on, output transistor 1 is conducting in a saturated state giving low-power dissipation thereof for a substantial time during its total period of on operation. When transistor 23 is turned on, the output transistor 1 is forced out of saturation into an unsaturated state, as previously described. Thereafter, output transistor 1 can be turned off quickly without the turnoff time delay associated with the charge accumulation in its base region because of operation in a saturated mode. Moreover, since output transistor 1 is operated only in an unsaturated condition for a relatively short period time, 10 microseconds minus the storage delay $t_s$, in this example, then the extra power dissipation associated with the output transistor 1 operating in an unsaturated mode is negligible. This is because the present configuration circumvents the storage delay $t_s$, and the output transistor 1 can therefore be driven more deeply into saturation than would otherwise be possible, thereby providing an actual decrease in the total power dissipation of this transistor 1 relative to less saturated operation.

Figure 4:
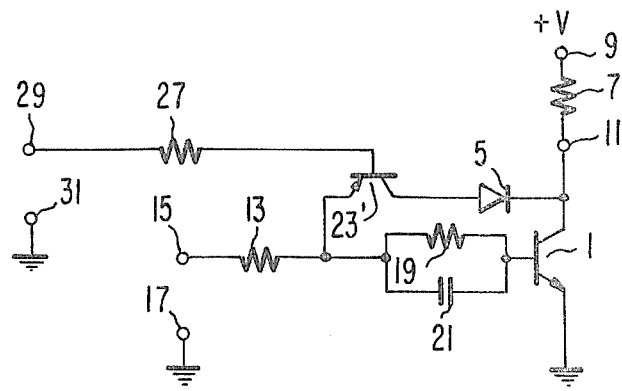
FIG. 4 is a circuit schematic diagram of another embodiment of the invention.

Diode 5, as previously noted, must have a fast recovery time. This diode 5 also serves a dual purpose of providing the current feedback path when transistor 23 and output transistor 1 are turned on at the same time, and blocking the high voltage from the collector electrode of transistor 23 when output transistor 1 is turned off. Accordingly, load transistor 23 can be a small signal, slow speed, low voltage, lower-power device. Also because transistor 23 is a PNP transistor, the control signals applied to input terminals 15 and 29 can be of the same polarity and the same signal, provided that the signal applied to input terminal 15 is properly delayed from the input signal applied to terminal 29. Also, as shown in FIG. 4, the diodes 3 and 25 can be replaced by the speedup circuit of resistor 19 and in parallel with capacitor 21, as previously described. It is required that the impedance of the speedup circuit 19,21 be greater than the sum of the impedance between the collector-emitter electrodes of transistor 23 when turned on and the impedance of diode 5 when forwardbiased. This ensures that the voltage drop across the speedup circuit 19,21 is always greater than the voltage drop across the collector-emitter electrodes of transistor 23 when turned on in sum with the voltage drop across diode 5 when forwardbiased. In addition, note that the present gated-clamping configuration FIGS. 3 and 4 can be adapted to any power switch using NPN or PNP transistors or Darlington's or large-power blocks in place of the output transistor 1. The current source or limiting resistors 27 and 13 are generally required, as previously mentioned, when the control signal source or sources are voltage sources, and are not generally required when the control signal source or sources are current sources. Transistor 23 is preferably a PNP transistor connected as shown, but as would be known to one skilled in the art, a silicon-controlled rectifier, NPN transistor, and other such switching devices can be substituted in place of the PNP transistor 23.

What is claimed is:

1. A transistor switching circuit, comprising:
a power terminal for receiving an operating voltage;
a reference terminal for connection to a point of reference potential;
first and second input terminals for receiving first and second control signal, respectively;
an output terminal in combination with said power terminal providing for connection of a load impedance therebetween;
an output transistor having collector, emitter, and base electrodes, said collector and emitter electrodes being connected between said output and reference terminals, respectively;
impedance means connected between said first input terminal and the base electrode of said output transistor;
unidirectional current means having first and second electrodes, the latter being connected to the collector electrode of said output transistor; and
switching means having a main current conduction path connected between the first input terminal and the first electrode of said unidirectional current means, and a control terminal connected to said second input terminal, whereby whenever said first and second control signals are concurrently at individual and not necessarily equal first states of voltage, respectively, said switching means responds to the first state of said second control signal by substantially opening its main current conduction path, thereby preventing current flow through said unidirectional current means, said first state of said first control signal causing base current to flow through said impedance means and said output transistor, turning on said output transistor into saturation, whenever said first and second control signal concurrently have said first and a second states of voltage, respectively, said switching means responds to the second state of said second control signal by substantially closing its main current conduction path, thereby permitting the flow of current through said unidirectional current means, said unidirectional current means being polarized for diverting some current away from the base electrode of said output transistor, to the collector electrode of said output transistor, thereby reducing the magnitude of the base current, the impedance of said impedance means being greater than the impedance of said unidirectional current means, causing the voltage drop across said impedance means to be greater than that across said unidirectional current means, thereby preventing saturation of said output transistor, whereby if said first and second control signals are then concurrently placed at respective second states of voltage, the second state of said first control signal being a voltage level for turning off said output transistor, base current flow in said output transistor is rapidly reduced for fast turnoff thereof.

2. The transistor switching circuit of claim 1, wherein said switching means is a transistor having a base electrode connected to said second input terminal, and collector and emitter electrodes included in its main curent conduction path, its collector and emitter electrodes being connected for conducting current in the same direction as said unidirectional current means.

3. The transistor switching circuit of claim 1, wherein said unidirectional means includes a diode.

4. The transistor switching circuit of claims 1, or 2, or 3, wherein said impedance means includes at least two diodes connected in series, and polarized for permitting base current to flow between the base electrode of said output transistor and said first input terminal.

5. The transistor switching circuit of claims 1, or 2, or 3, wherein said impedance means includes:
a resistor; and
a speedup capacitor connected in parallel with said resistor.

6. The resistor switching circuit of claim 1, further including:
a first current limiting resistor connected with one end to said first input terminal, and another end to said impedance means, said first resistor and said impedance means being connected in series between said first input and the base electrode of said output transistor; and
a second current limiting resistor connected between said second input terminal, and the control terminal of said switching means.

7. In a transistor switching circuit including an output transistor having base, emitter and collector electrodes, a load connected between a source of operating voltage and the collector electrode, a source of reference potential connected to the emitter electrode, impedance means connected between an input terminal for receiving a first control signal and the base electrode, and a diode connected between the collector electrode and the input terminal, said impedance means having a greater impedance than said diode when forward biased, said diode being polarized for diverting current away from said base electrode, whenever said transistor is turned on via the application of a first level of said control signal to said input terminal, thereby preventing said transistor from turning on into saturation, whereby operation of said transistor in an unsaturated state reduces the level of accumulation of stored charge in its base region relative to its saturated state, permitting faster turnoff of said transistor via the application of a second level of said control signal, but higher power dissipation of said transistor while conducting in this nonsaturated state relative to a saturated state, wherein the improvement comprises:
switching means having a main current conduction path connected in series with said diode between said input terminal and collector electrode, said switching means being operable to a first condition for substantially increasing the relative impedance of its main current conduction path, thereby substantially preventing diversion current flow through said diode, for permitting said output transistor to be operated into a saturated state, for obtaining faster turnon and lower power dissipation relative to operation in an unsaturated state, said switching means being operable to a second condition a short time before turning off said output transistor, for substantially decreasing the relative impedance of its main current conduction path, thereby allowing diversion current to flow through said diode, permitting said output transistor to only operate in an unsaturated state, for obtaining fast turnoff.

8. The transistor switching circuit of claim 7, wherein said switching means includes a mode transistor having collector and emitter electrodes in its main current path, and a base electrode for receiving a second control signal, whereby a first level of said second control signal turns off said mode transistor, this being its first condition, and a second level of said second control signal turns on said mode transistor, this being its second condition.

9. The transistor switching circuit of claims 7, or 8, wherein said impedance means includes at least a pair of diodes connected in series between said input terminal and the base electrode of said output transistor, said pair of diodes being polarized in the same direction as the base-emitter junction of said output transistor.

10. The transistor switching circuit of claims 7, or 8, wherein said impedance means includes:
a resistor; and
a speedup capacitor connected in parallel with said resistor.

11. The transistor switching circuit of claim 7, further including a current limiting resistor connected between said input terminal and said impedance means, said resistor and impedance means being connected in series between the base of said output transistor and said first input terminal.

12. A transistor switching circuit comprising:
a power terminal for receiving an operating voltage of positive polarity;
an output terminal, said power and output terminals providing for connection of a load therebetween;
a reference terminal for connection to a point of reference potential;
an NPN output transistor having an emitter electrode connected to said reference terminal, a collector electrode connected to said output terminal, and a base electrode;
first and second input terminals for receiving first and second control signals, respectively;
diode means having an anode electrode, and a cathode electrode connected to the collector electrode of said output transistor;
impedance means having one end connected to the base electrode of said output transistor, and another end connected to said first input terminal, the impedance of said impedance means having a magnitude that is greater than the impedance of said diode means, when the latter is forward biased; and a PNP switching transistor having an emitter electrode connected to said first input terminal, a collector electrode connected to the anode electrode of said diode means, and a base electrode connected to said second input terminal;

said first and second control signals each having a relatively "high" level for turning on into saturation said NPN output transistor, and turning off said PNP switching transistor, respectively, thereby providing the fastest turnon time and least power dissipation of said output transistor, said second control signal being made "low" for causing base current flow in said PNP transistor, turning on this PNP transistor, thereby substantially connecting said diode means between the impedance means and the collector electrode of said output transistor, some base current being diverted from the base of said output transistor, to the collector of said output transistor, causing said output transistor to come out of saturation, thereafter the level of said first control signal is made "low" for turning off said output transistor from its unsaturated state, thereby providing faster turnoff relative to a saturated state.

13. The transistor switching circuit of claim 12, wherein said impedance means includes a pair of diodes connected in series, and polarized for conducting current to the base electrode of said output transistor.

14. The transistor switching circuit of claim 12, wherein said impedance means includes:
a resistor; and
a speedup capacitor connected in parallel with said resistor.

15. The transistor switching circuit of claim 12, further including:
a first circuit limiting resistor connected between said first input terminal and the common connection between the emitter of said PNP transistor and said impedance means.

16. A method for operating a transistor switching circuit, including an output transistor having base, emitter, and collector electrodes, a load being connected between a source of operating voltage and said collector electrode, a point of reference potential being connected to said emitter electrode, comprising the steps of:
providing sufficient current flow in the base electrode of said output transistor for rapidly turning it on into saturation, for obtaining the lowest power dissipation and fastest turnon thereof; and
diverting a portion of the base current flow from the base electrode to the collector electrode, only a short time before it is desired to turnoff said output transistor, thereby bringing said output transistor out of saturation for permitting faster turnoff thereof relative to its saturated state, via the subsequent removal of base current or backbiasing of the base-emitter junction of said output transistor.

17. A transistor switching circuit comprising:
an output transistor having base, emitter, and collector electrodes, a load being connected between a source of operating voltage and said collector electrode, a point of reference potential being connected to said emitter electrode;

means for supplying current to the base electrode of said output transistor for rapidly turning it on into saturation, for obtaining substantially low power dissipation during a substantial period of the time said transistor is turned on, and for obtaining relatively fast turnon time; and means for diverting a portion of the base current flow from the base electrode to the collector electrode of said output transistor, only a short time before it is desired to turnoff said output transistor, thereby bringing said output transistor out of saturation for permitting faster turnoff thereof relative to its saturated state, via the subsequent removal of base current or backbiasing of the base-emitter junction of said output transistor.

18. The transistor switching circuit of claim 17, wherein said means for supplying current includes:
impedance means having a first terminal connected to said base electrode and a second terminal receptive of a control signal, whereby the base current is supplied during times that said control signal is of a first state, and the base-emitter junction of said transistor is backbiased during times that said control signal is of a second state.

19. The transistor switching circuit of claim 18 wherein said means for diverting current includes:
unidirectional current means having one end connected to the collector electrode of said output transistor; and
switching means having a main current conduction path connected between said second terminal of said impedance means and the other end of said unidirectional current means, said switching means being selectively operable to a first condition for opening its main current conduction path, thereby preventing diversion of base current, permitting said transistor to operate in a saturated state, and to a second condition for closing its main current conduction path, thereby substantially connecting said unidirectional current means to said second terminal of said impedance means, said unidirectional current means being polarized for conducting current away from said base electrode, the voltage drop across said impedance means being greater than that across said unidirectional current means at this time, causing said output transistor to come out of saturation.

* * * * *